United States Patent [19]

Kawata

[11] Patent Number: 5,728,492
[45] Date of Patent: Mar. 17, 1998

[54] MASK FOR PROJECTION SYSTEM USING CHARGED PARTICLE BEAM

[75] Inventor: Shintaro Kawata, Moriyamachi, Japan

[73] Assignee: Nikon Corporation, Tokyo, Japan

[21] Appl. No.: 649,489

[22] Filed: May 17, 1996

[30] Foreign Application Priority Data

May 17, 1995 [JP] Japan .................................. 7-118378
Apr. 22, 1996 [JP] Japan .................................. 8-100342

[51] Int. Cl.$^6$ .................................................. G03F 9/00
[52] U.S. Cl. ...................................... 430/5; 430/296
[58] Field of Search .......................... 430/5, 296, 311, 430/313, 394; 378/34, 35

[56] References Cited

U.S. PATENT DOCUMENTS 4,448,865  5/1984  Bohlen et al. .................. 430/5
5,279,925  1/1994  Berger et al. .................. 430/296

OTHER PUBLICATIONS

Windischmann et al., "Properties of Diamond Membranes for X-Ray Lithography", J. Appl. Phys. 68(11), Dec. 1990.
Nakayama et al., "Thermal Characteristics of Si Mask for EB Cell Projection Lithography", J. Appl. Phys. vol. 31 (1992) pp. 4268-4272, Part 1, No. 12B, Dec. 1992.
Sohda et al., "Cell Projection Lithography with Scattering Contrast", J. Appl. Phys., vol. 33 (1994) pp. 6940-6945.

Primary Examiner—S. Rosasco
Attorney, Agent, or Firm—Cushman Darby & Cushman IP Group of Pillsbury Madison & Sutro LLP

[57] ABSTRACT

A mask is proposed which restrains thermal deformation caused by irradiation by a charged particle beam and thereby increases the accuracy of pattern projection. In order to do this, in this mask for projection system using a charged particle beam according to the present invention, which has a mask base plate which is made from a semiconductor material and which is formed with holes which allow passage of the charged particle beam, at least a specified region around the periphery of the through holes of the mask base plate is covered with a layer of diamond. It is desirable further to cover this diamond layer with a layer of an electroconductive material, in order to prevent static charging up upon it.

18 Claims, 10 Drawing Sheets

MASK FOR PROJECTION SYSTEM USING CHARGED PARTICLE BEAM

BACKGROUND OF THE INVENTION

1. Field of the Invention

The present invention relates to a mask for use in a process of pattern transcription which employs a beam of charged particles, such as an electron beam, an ion beam, etc.

2. Description of the Related Art

There are various per se known masks of this type, two of which are, by way of example, shown schematically in FIGS. 9A and 9B. The mask 1 shown in FIG. 9A comprises a mask base plate 2 made of silicon through which a plurality of through holes 3 are fabricated. The mask base plate 2 is formed with a thickness sufficient to absorb an electron beam which is directed against it; for example, if the acceleration voltage for the electron beam is 50 kV, the mask base plate 2 may have a thickness of 50 µm. Accordingly, the electron beam which is directed against the mask 1 can only pass through the holes 3 thereof, and, when the transmitted electron beam EB is focused by a pair of focusing lenses 4a and 4b upon a resist surface of a sensitive base plate 5 (for example, a resist-coated silicon wafer), a pattern which corresponds to the format of the through holes 3 is transcribed onto the sensitive base plate 5.

On the other hand, the mask 6 shown in FIG. 9B comprises a mask base plate 7 made of silicon and a scatterer 8 fixed upon the surface thereof, and the mask base plate 7 is thinned down to a thickness of from a few µm to a few hundreds of a µm so that it is transparent to the electron beam (although this depends upon the acceleration voltage for the electron beam). When an electron beam is directed against this mask 6, the amount of forward scattering of the electron beam EB2 which has passed through the scatterer 8 as well as the mask base plate 7 (shown by the double dotted broken lines in the figure) is greater than the amount of forward scattering of the electron beam EB1 which has only passed through the mask base plate 7 (shown by the solid lines in the figure). Accordingly, if an aperture 9 is positioned in the vicinity of the crossover image CO created by the focusing lens 4a from the electron beam, contrast is obtained upon the sensitive base plate 5 in accordance with the degree of scattering of the electron beams EB1 and EB2. Moreover, although in FIG. 9B the case is shown in which the electron beam EB2 for which the amount of forward scattering is greater is interrupted by the aperture 9, it can also happen that the electron beam EB1 for which the amount of forward scattering is smaller is the one which is thus interrupted. When the acceleration voltage for the electron beam which is directed against this mask 6 is relatively low, the electron beam is completely absorbed by the scatterer 8. In the following discussion, when it is necessary to distinguish particularly between the mask of FIG. 9A and the mask of FIG. 9B, the mask of FIG. 9A through which the through holes 3 are fabricated will be referred to as a stencil mask, while the mask of FIG. 9B which has no through holes will be referred to as a transparent scattering mask.

During pattern projection using a charged particle beam, the energy of the charged particles which are absorbed by the mask is converted into heat, and accordingly the temperature of the mask rises. This rise of temperature causes heat deformation of the mask, and as a result positional deviation of the projected pattern and the like are generated, so that the quality of the projection is deteriorated. In connection with this temperature rise of the mask, certain matters have been disclosed by Y. Nakayama et. al. in the Japanese Journal of Applied Physics for December 1992, B6940–6945 (31,4268 (1992)), and by Y. Soda et. al. in the Japanese Journal of Applied Physics for December 1994, B4268–4272 (31,4268 (1994)). According to these publications, under irradiation by an electron beam of 50 kV and 15 µA, a silicon base board of thickness 50 µm experiences a temperature rise of as much as 800° C., while even if the silicon base board is thinned down to a thickness of 1 µm the rise in temperature is only reduced to 20% of this level, i.e. to about 160° C. In this connection, in order to keep the positional deviation of the transcribed pattern to less than about 0.02 µm, it is necessary to control the rise in temperature of the mask so as to keep it less than about 20° C. (provided that the pattern reduction ratio between the mask and the sensitive base board is ⅕). Accordingly, the countermeasures against rise of temperature which have been available up to the present are not sufficient—which is a matter of course with the stencil mask of FIG. 9A, and is also the case if a transparent scattering mask like the mask of FIG. 9B is employed. The temperature rise can be restricted by thinning down the mask base plate yet further, but the technology available for manufacturing the mask sets a limit upon this process. Further, it is indispensable to increase the electrical current flow of the charged particle beam to a high level in order to improve the throughput of the projection system, and this has a tendency to increase the amount of heat deformation of the mask, but on the other hand increase of the accuracy is also required, and accordingly management of the temperature of the mask has become an extremely troublesome problem.

SUMMARY OF THE INVENTION

The objective of the present invention is to provide a mask for a projection system using a charged particle beam whose temperature deformation when irradiated with such a charged particle beam is restrained so that the accuracy of projection is elevated.

In order to attain this objective, the present invention provides a mask for a charged particle projection system in which a pattern generation region (the region outlined by the single dotted broken line in FIG. 2) modifies a beam of charged particles according to a predetermined projection pattern, comprising a first layer of which, in this pattern generation region, the planar form is specified in accordance with the pattern; and a second layer layered together with the first layer and made from a material whose coefficient of linear expansion is less than that of the material of the first layer.

According to the present invention as described above, since the thermal deformation of the second layer which has the smaller coefficient of linear expansion is less than that of the first layer, the thermal deformation of the pattern generation region as a whole is restrained as compared with the case in which only the first layer is provided, and accordingly it is possible to elevate the accuracy of projection.

On the other hand, as an alternative, it is also possible for the second layer which is layered together with the first layer to be made from a material whose coefficient of thermal conductivity is greater than that of the material of which the first layer is made. The conduction of heat to the outside of the pattern generation region is thus encouraged by this second layer whose coefficient of thermal conductivity is the greater, and as a result the rise in temperature of the pattern generation region as a whole is reduced, and thus thermal deformation thereof is restrained.

It is also possible and desirable, as a specialization of the present invention, for the second layer which is layered together with the first layer to be made from a material whose coefficient of linear expansion is less than that of the material of the first layer, and moreover whose coefficient of thermal conductivity is greater than that of the material of the first layer. According to this specialization of the present invention, the thermal deformation of the pattern generation region is restrained by the second layer which has the smaller coefficient of linear expansion. Further, the conduction of heat to the outside of the pattern generation region is encouraged by the second layer whose coefficient of thermal conductivity is the greater. As a result, the thermal stresses which are caused by the mutual difference between the first layer and the second layer with regard to coefficient of linear expansion are restrained. Furthermore, by thus restraining the thermal stresses which are due to the mutual difference in coefficients of linear expansion between the first layer and the second layer, it is possible to enhance the durability of the mask. Moreover, the heat which is conducted to the outside of the pattern generation region via the second layer is effectively dealt with by providing a heat receiving region or a mask holding region around the periphery of the pattern generation region, and thus it is possible effectively to restrain the temperature deformation of the mask as a whole.

When the mask is to be irradiated with the charged particle beam, the pattern generation region is disposed within a vacuum container of the projection system, and since in this state it is not possible to anticipate any heat radiation from the pattern generation region itself, in order to restrain the rise in the temperature of the pattern generation region, it is effective to encourage heat transmission by the two preferred embodiments of the present invention as discussed above. It is desirable to manage the heat which is conducted to the outside from the pattern generation region by providing a heat receiving region around the pattern generation region which has a heat capacity which is greater than that of the pattern generation region. That is to say, the heat in the pattern generation region is able to escape to the heat receiving region via the second layer, and thereby thermal deformation of the entire mask is restrained. Further, by providing a mask holding region around the periphery of the pattern generation region, the heat in the pattern generation region is able to escape to the mask holding region via the second layer. Since this mask holding region is kept in contact with a mask holding member of the projection system, the heat will not be kept within the mask, provided that a heat conduction path is assured to the outside of the vacuum container from the mask holding member.

It is also acceptable to form the first layer from a material which is particularly beneficial for easily obtaining a finely worked shape in correspondence with the projection pattern. When for example a semiconductor such as silicon or the like is used, it will easily be possible to obtain a fine projection pattern using per se known semiconductor working technology. When the first layer is made from a semiconductor material such as silicon or the like, it is desirable to use diamond as the material for the second layer, since diamond has a relatively low coefficient of linear expansion and also has a high coefficient of thermal conductivity. Alternatively, as a material other than diamond which has a small coefficient of linear expansion, various types of ceramic such as glasses may be used, or alumina. Further, it is possible to use copper or silver, as being materials which have high coefficients of thermal conductivity.

According to another aspect of the present invention, a mask for a charged particle projection system is provided in which a pattern generation region modifies a beam of charged particles according to a predetermined projection pattern. The mask comprises a layer made from diamond in the pattern generation region. Thermal deformation of the pattern generation region is restrained by the diamond layer. That is to say, the coefficient of thermal conductivity of diamond at room temperature is about 20 W/cm°K, and this value is about ten times or more greater than the coefficient of thermal conductivity of silicon which may be taken as a representative prior art material for formation of the pattern generation region, which is about 1.5 W/cm°K. Furthermore, the coefficient of linear expansion of diamond is about $0.8 \times 10^{-6}$, and this value is about ⅓ of the coefficient of linear expansion of silicon, which is about $2.6 \times 10^{-6}$. Accordingly, if a layer of diamond is provided in the pattern generation region, it is possible to restrict the thermal deformation to less than about ⅓₀th of what it is in the prior art case in which the pattern generation region is simply formed of silicon.

In this connection, in the case of a stencil type mask, if a pattern layer which is made from a material other than diamond is formed in a planar shape in correspondence with the projection pattern and a diamond layer is superposed thereupon, then the fabrication of the mask becomes very easy, since the mask formation according to the projection pattern is more easily obtained in this manner than by a process of minute formation of the diamond layer itself. By forming the pattern layer from a semiconductor material, and in particular by forming it from silicon, it is possible easily to form a minute projection pattern by using per se known semiconductor fabrication techniques for this pattern layer material. In order to bond together this pattern layer which has thus been formed according to the minute projection pattern and the diamond layer which is of high purity, it is suitable to layer the diamond layer upon the pattern layer by a process of vapor phase deposition. According to the vapor phase deposition, it is possible simply and easily to layer a diamond layer of high purity upon the pattern layer, even if the planar shape of the pattern layer is slightly deformed.

On the other hand, in the case of a transparent scattering type mask, a scattering element made from a material such as tungsten or the like is formed upon the diamond layer. If irradiation of the diamond layer by the beam of charged particles causes charging thereof which exerts an undue influence upon the paths of the charged particles in the beam, then, as a countermeasure, it will be effective to coat the diamond layer with an electrically conducting layer. Accordingly, the electrical charge will be allowed to escape via this conducting layer, and charging of the diamond layer will be prevented. The electrically conducting layer may be made from a non magnetic metallic material, and in particular tungsten or tantalum are desirable. It is desirable to avoid heavy metals. It is also possible to employ a macromolecular material for the conducting layer, as an alternative to a non magnetic metallic material. It should be noted that it is necessary to choose a material which is resistant to irradiation with a charged particle beam as the material for the conducting layer.

According to yet another aspect of the present invention, a mask for a charged particle projection system is provided, comprising a mask base plate in which a plurality of holes which are transparent to a beam of charged particles are formed, and which is made from a semiconductor material, and a diamond layer which covers at least a specific region of said mask base plate around said transparent holes (the region outlined by the single dotted broken line in FIG. 2). According to this construction, even if heat is generated in the region around the transparent holes, it is possible to restrain thermal deformation of the mask base plate by the diamond layer which has a lower coefficient of linear expansion and a higher coefficient of thermal conductivity than the semiconductor material of the mask base plate, and thereby the accuracy of projection is enhanced.

According to still yet another aspect of the present invention, a mask for a charged particle projection system is provided, comprising a mask base plate which comprises a diamond layer, and a scattering element, disposed upon said mask base plate, which specifies a pattern which is larger than the characteristic scale for absorption or scattering of a beam of charged particles by said mask base plate. According to this construction, it is possible to restrain thermal deformation and a rise of temperature of the mask base plate and of the scattering element by the diamond layer which is included in the mask base plate, and thereby the accuracy of projection is enhanced.

DESCRIPTION OF THE PREFERRED EMBODIMENTS

Preferred Embodiment 1

Figure 1:
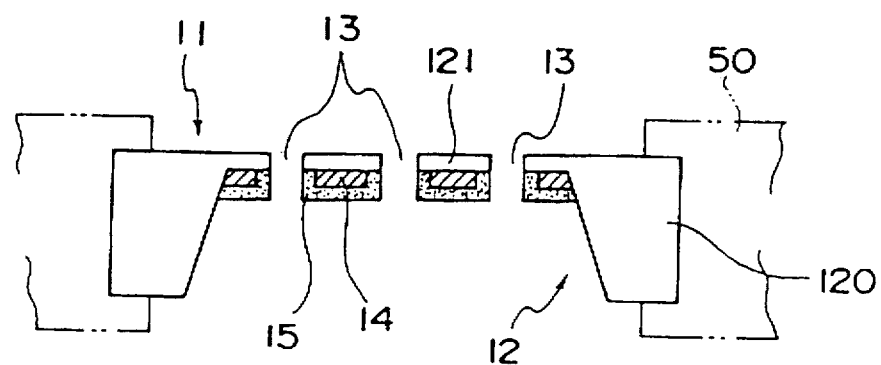
FIG. 1 is a cross sectional view of a mask according to the first preferred embodiment of the present invention.
Figure 2:
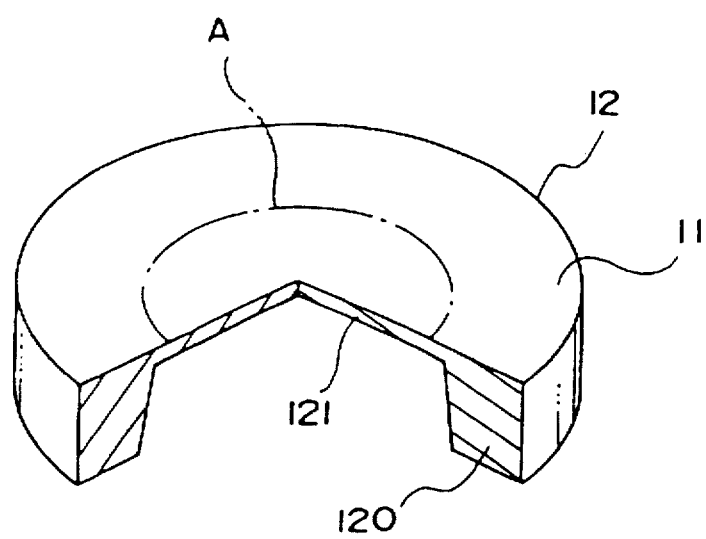
FIG. 2 is an external perspective view of this first preferred embodiment mask shown in FIG. 1 with a portion thereof cut away.

FIG. 1 shows a cross sectional view of the first preferred embodiment of the mask of the present invention, while FIG. 2 shows the external perspective appearance of this mask with a portion thereof cut away. This first preferred embodiment mask 11 is a so called stencil mask, and comprises a mask base plate 12 made of silicon through which are fabricated a set of holes 13 which are capable of passing an electron beam, i.e. are transparent thereto. The mask base plate 12 is formed in the shape of a circular plate, as shown in FIG. 2, and comprises a mask support portion 120, which is generally toroidal and relatively thick and which extends around the outer periphery of the mask base plate 12. A pattern formation portion 121 (the region which in FIG. 2 is surrounded by the single dotted broken line) which is reduced to a thin layer by a process of etching or the like is provided as extending across the inner hole of this toroidal mask support portion 120, from its inner circumference. As shown in FIG. 1, the transparent holes 13 are formed through this pattern formation portion 121. A diamond layer 14 is fixed to and extends all over the lower surface in the figure of the pattern formation portion 121, and a tungsten layer 15 is fixed to and extends all over the lower surface in the figure of this diamond layer 14. The diamond layer 14 may, for example, be deposited as a layer upon the lower surface of the mask base plate 12 by a process of vapor phase deposition.

It would also be favorable to interpose an intermediate layer between the mask base plate 12 and the diamond layer 14, with the objective of strengthening the bond between them.

Figure 9A:
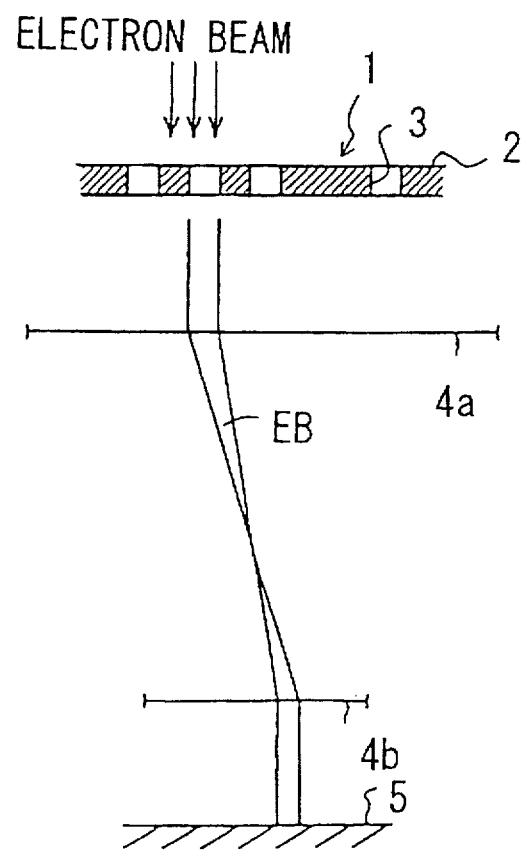
FIGS. 9A and 9B are schematic figures which relate to the prior art and show a mask for electron beam projection, for explanation of the theory relating to the projection performed thereby.
Figure 9B:
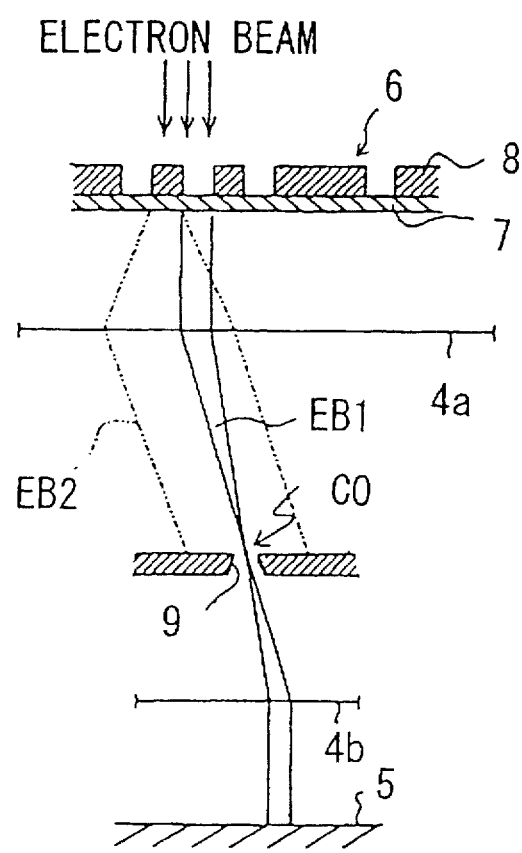

As for the thicknesses of the pattern formation portion 121 and the diamond layer 14, as an example, in the case that projection is to be performed using a 50 kV electron beam, these may respectively be set to 1 μm and 50 μm. And the thickness of the tungsten layer 15, which is provided in order to drain off electric charge on the diamond layer 14 so as to inhibit heat deformation of the mask 11, may in this exemplary case be set to 50 nm. In the event that it is necessary to reduce further the thickness of the pattern formation portion 121 to about 0.5 μm or less, it will become necessary to reduce further the thickness of the diamond layer 14. In this case, since the electron beam will be scattered by the mask 11 as it passes through it, this becomes an intermediate mask between the two types of mask which were explained above in connection with the prior art and with reference to FIGS. 9A and 9B. This is termed a scattering stencil mask. An aperture 9 becomes necessary for this electron beam irradiation system, as was explained with reference to FIG. 9B. As an example, in the case of a projection system using an electron beam of 100 kV, the thicknesses of the pattern formation portion 121 and of the diamond layer 14 may both be set to 1 μm. This is determined by the thickness through which the electron beam can pass, due to the inelastic scattering mean free path. Further, the thickness of the tungsten layer 15 for draining off electric change may in this case be set to a few nm.

Figure 3A:
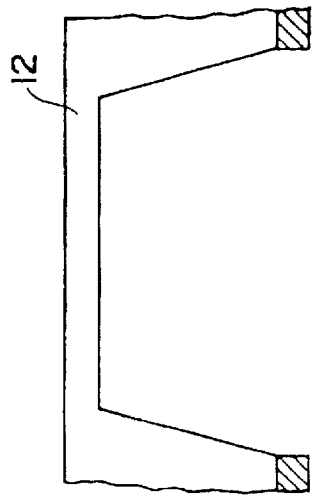
FIGS. 3A through 3H are schematic cross sectional views showing a process for manufacture of this first preferred embodiment mask shown in FIGS. 1 and 2.
Figure 3B:
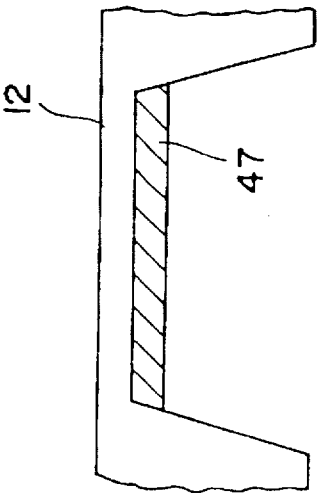
Figure 3C:
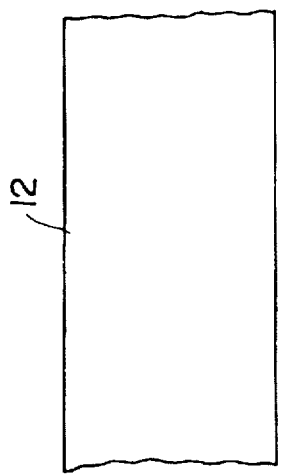
Figure 3D:
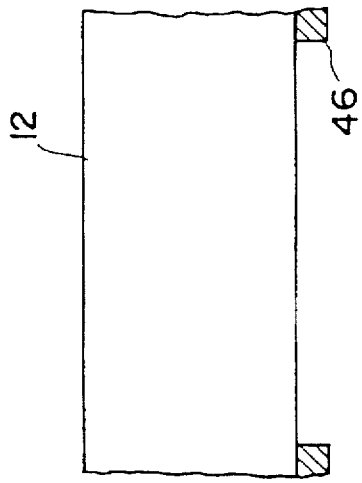
Figure 3E:
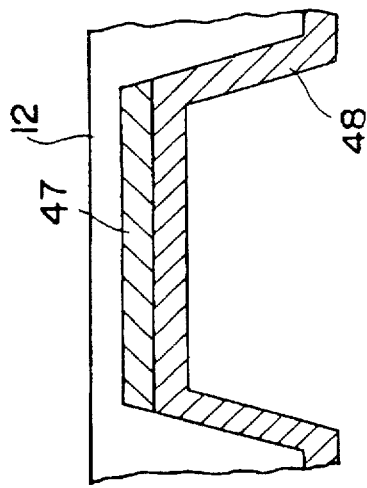
Figure 3G:
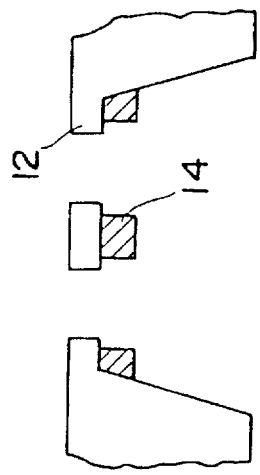
Figure 3F:
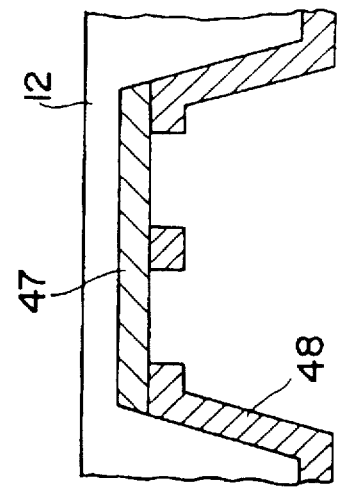
Figure 3H:
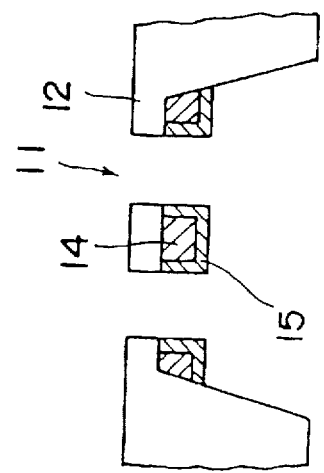

This mask 11 according to the first preferred embodiment of the present invention may be fabricated, for example, according to the sequence shown in FIGS. 3A through 3H. First, as shown in FIG. 3B, a resist pattern 46 is layered upon a mask base plate 12 shown in FIG. 3A which is formed of silicon doped with boron, and then as shown in FIG. 3C the mask base plate 12 is etched so as to reduce its exposed portions to a thin layer. Next, as shown in FIG. 3D, a diamond layer 47 is deposited upon these exposed portions which have been thinned down, and the resist pattern 46 is removed. Then, as shown in FIG. 3E, a resist layer 48 is layered upon the surfaces of the mask base plate 12 and the diamond layer 47. Next, as shown in FIG. 3F, the resist layer 48 is removed by a per se known process of photolithography according to a projection pattern, and then as shown in FIG. 3G the diamond layer 47 and the mask base plate 12 are simultaneously etched, and also the resist layer 48 is completely removed, so as to result in the formation according to the projection pattern of the diamond layer 14 layered upon the mask base plate 12. Finally, as shown in FIG. 3H, the production of the mask 11 is completed by the formation of the tungsten layer 15 upon the diamond layer 14.

When the mask 11 constructed as described above is fitted to an electron beam projection system, its mask support portion 120 is held by a mask holding member 50 (for example, a mask stage) of the electron beam projection system, as shown by the double dotted broken lines in FIG. 1. Accordingly, heat generated in the pattern formation portion 121 is effectively transmitted via the diamond layer 14 and the mask support portion 120 to the mask holding member 50. Since the heat capacity of the mask support portion 120 is relatively high, its heat deformation is kept low even though heat is transmitted thereto from the diamond layer 14. The tungsten layer 15 is electrically connected to the mask support portion 120 so as to keep it and the mask base plate 12 at the same electrical potential. As a result, charging on the diamond layer 14 is prevented. Care is required, because if the surface of the mask support portion 120 becomes covered with a layer of oxide the tungsten layer 15 and the mask base plate 12 will be insulated.

It should be understood that the above described mask 11 may be fitted either to an electron beam projection system of the type which transcribes a pattern to a base plate by a single electron beam exposure, or to an electron beam projection system of the type which images a pattern having a plurality of secondary views on a base plate.

Figure 4:
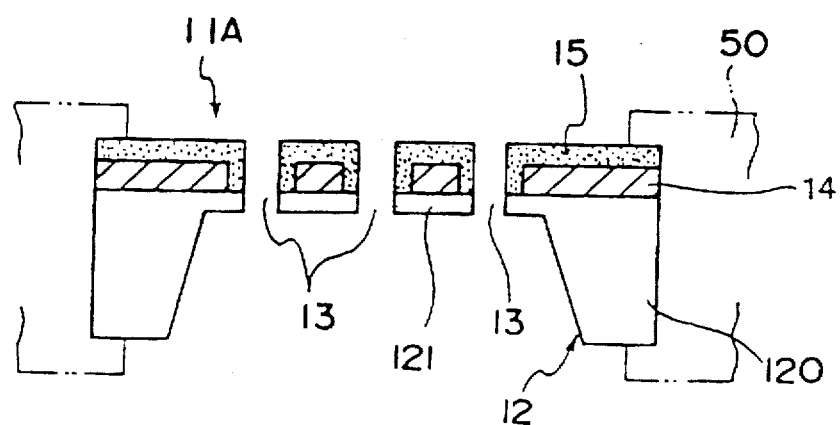
FIG. 4 is a sectional view similar to FIG. 1, showing a variant of this first preferred embodiment.

Further, as a variant of this first preferred embodiment, it is also possible to layer the diamond layer 14 and the tungsten layer 15 over the entire extent of the upper surface of the mask base plate 12, as in the case of the mask plate 11A shown in FIG. 4. In the example shown in FIG. 4, in order not to obstruct the transmission of heat from the diamond layer 14 to the mask holding member 50, the tungsten layer 15 may be formed of the minimum limit thickness required for draining off the electric charge of the diamond layer 14, i.e. for example of a thickness of about 50 nm.

Preferred Embodiment 2

Figure 5:
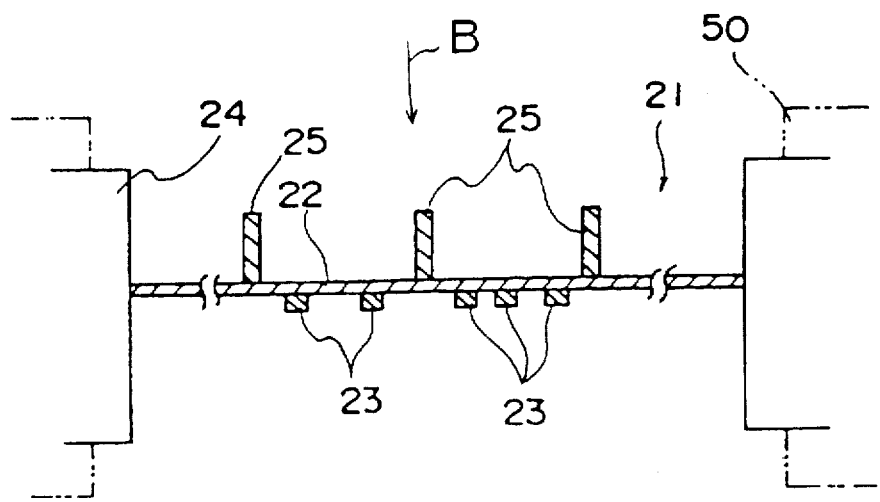
FIG. 5 is a cross sectional view, similar to FIG. 1 for the first preferred embodiment, showing a mask according to the second preferred embodiment of the present invention.
Figure 6:
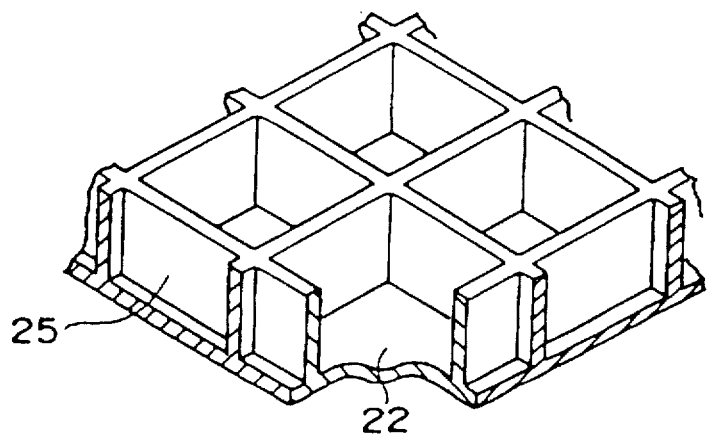
FIG. 6 is a perspective view showing an essential portion of this second preferred embodiment mask of FIG. 5 with a portion thereof cut away.
Figure 7:
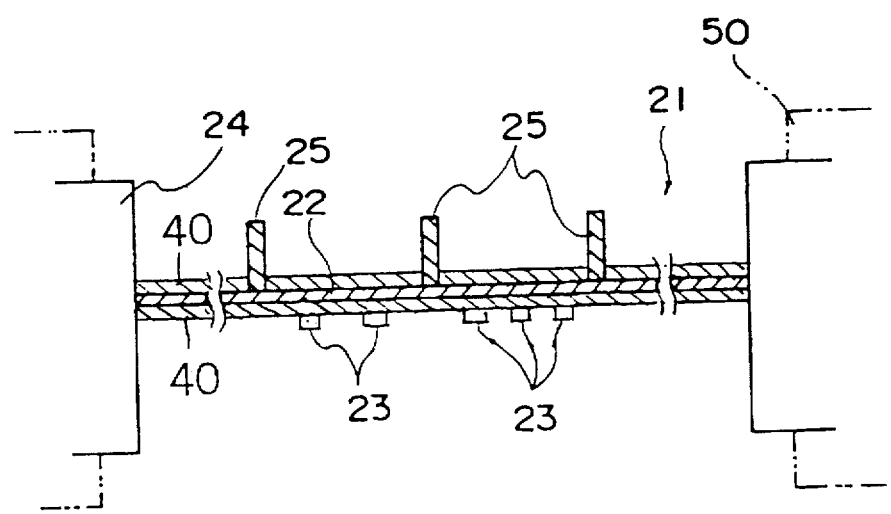
FIG. 7 is a sectional view similar to FIG. 5, showing a variant of this second preferred embodiment.

FIG. 5 shows a cross sectional view of the second preferred embodiment of the mask of the present invention. This mask 21 is a so called transparent scattering mask, in which a scattering element 23 is fixed upon one side of a mask base plate 22 of which the thickness is so much reduced as to make it transparent to an electron beam. The mask base plate 22 is made of diamond, and its outer circumferential portion is fixed to an outer frame 24 which is formed as a large thick circular ring. The scattering element 23 may, for example, be made of tungsten, and its surface shape (its shape as seen in the direction shown by the arrow B in FIG. 5) is determined according to the shape of the pattern which it is desired to transcribe. A strut structure 25 is fixed to the opposite side of the mask base plate 22 from the scattering element 23. As shown in FIG. 6, this strut structure 25 is formed as a lattice, and its outer portion is fixed to the outer frame 24. Accordingly, the mask base plate 22 is supported by the strut structure 25. The outer frame 24 may for example be made of copper, while for example the strut structure 25 may be made of silicon. The thicknesses of the mask base plate 22 and of the scattering element 23, in the exemplary case that an electron beam of 100 kV is to be used, may be set to 100 nm and 40 nm respectively. These thicknesses of the mask base plate 22 and of the scattering element 23 are determined according to the value of the elastic scattering mean free path corresponding to the acceleration voltage for the electron beam, and also according to the contrast of the pattern which it is desired to transcribe. The mask base plate 22 should have a thickness comparable to the mean free path, while the scattering element 23 should have a thickness several times as large as the mean free path. For an electron beam of 100 kV, the mean free path for diamond is 82 nm, while for tungsten it is 8 nm. With a mask of the construction described above, since the entire mask base plate 22 is made of diamond, the conduction away of the heat generated in the mask base plate 22 and in the scattering element 23 is substantially enhanced by comparison to the case in which the base plate is made of silicon, so that heat deformation of the mask 21 is accordingly sufficiently minimized. The heat which is conducted to the outer frame 24 can be easily extracted therefrom by the mask holding member 50 which is supporting it, and therefrom to the main body of the electron beam projection system. Moreover, if charging on the mask base plate 22 should become a problem, it is possible to cover the mask base plate 22 with an electroconductive layer a few nm in thickness made of tungsten or the like, in the same way as with the first preferred embodiment, as shown in FIG. 7.

Figure 8A:
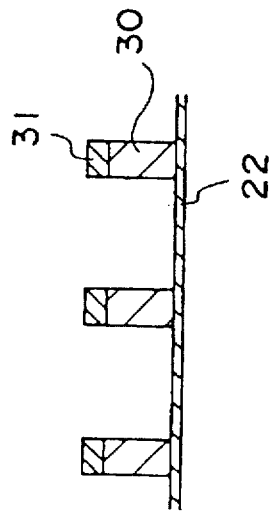
FIGS. 8A through 8H are schematic cross sectional views showing a process for manufacture of this second preferred embodiment mask shown in FIGS. 5 and 6.
Figure 8B:
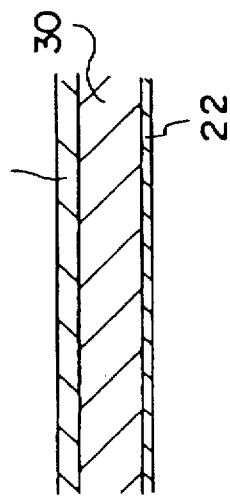
Figure 8C:
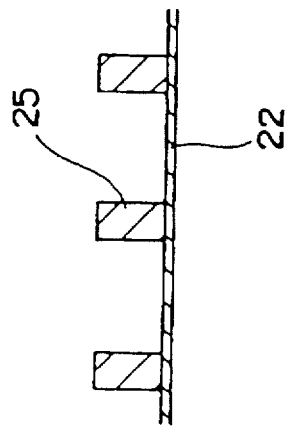
Figure 8D:
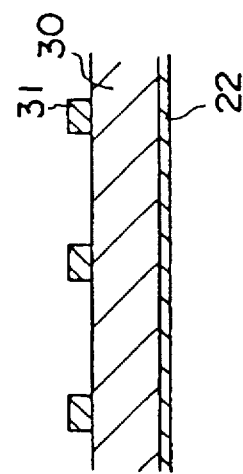
Figure 8E:
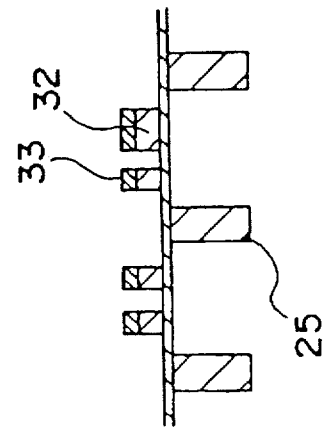
Figure 8G:
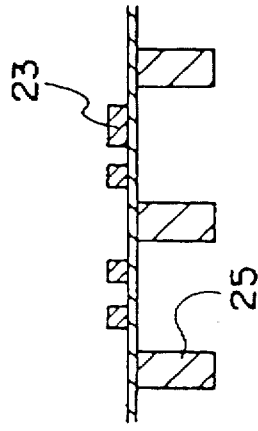
Figure 8F:
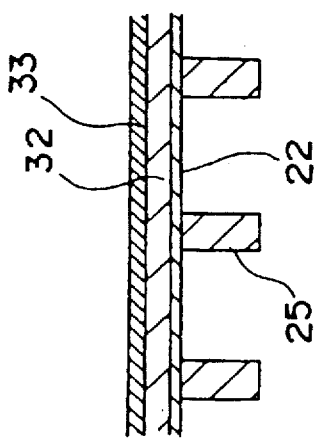
Figure 8H:
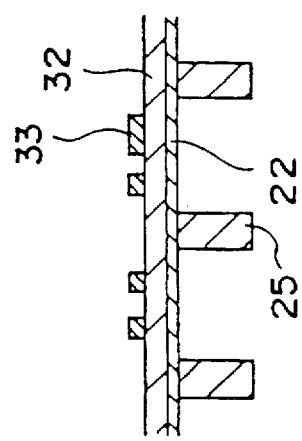

The mask 21 of this second preferred embodiment may be fabricated, for example, according to the sequence shown in FIGS. 8A through 8H. First, as shown in FIG. 8A, a mask base plate 22 which is made of diamond and an etchable layer 30 which is made of the material for the strut structure 25 are layered together, and then a resist layer 31 is layered upon the surface of the etchable layer 30. At this time, it is desirable first to make the etchable layer 30 using silicon or the like, and then to layer the mask base plate 22 made of diamond upon one side thereof by using a process of vapor phase deposition. Next, as shown in FIG. 8B, the resist layer 31 is formed into the shape of a lattice by a per se known process of photolithography, and then as shown in FIG. 8C the etchable layer 30 is etched. Next, as shown in FIG. 8D, the resist layer 31 is completely removed, so as to leave the strut structure 25. Next, as shown in FIG. 8E, an etchable layer 32 which is made of the material for the scattering element 23 is layered upon the other side of the mask base plate 22, and a resist layer 33 is layered upon the surface of this etchable layer 32. Next, as shown in FIG. 8F, the resist layer 33 is removed according to the projection pattern by a per se known process of photolithography, and then as shown in FIG. 8G the etchable layer 32 is etched. Finally, as shown in FIG. 8H, the production of the mask 11 is completed by the resist layer 33 being completely removed to form the scattering element 23.

Now, although it is desirable to fit the mask 22 of this second preferred embodiment to an electron beam projection system of the type which images a pattern having a plurality of secondary views on a base plate, it can also be applied to an electron beam projection system which images a pattern to a base plate by a single electron beam exposure.

In both of the above described preferred embodiments, deformation by heat of the diamond layer 14 or of the mask base plate 22 which was made of diamond was effectively restrained by the use of diamond as the material for these elements, but the present invention is not to be considered as limited to the case of diamond being employed as this material; this material may be appropriately varied as desired, provided that it is a material which has lower linear expansion coefficient, and/or higher heat conductivity, than the material for fabrication of the projection pattern for the mask, i.e. than the material for the mask base plate 12 in the case of the first preferred embodiment or the material for the scattering element 23 in the second preferred embodiment. Furthermore, the material for the electroconductive layer is not limited to tungsten; various types of non magnetic metallic material may be utilized, or a macromolecular material of high electrical conductivity, or the like. Other variations of the form and content of any particular embodiment of the present invention are possible, without departing from its scope. Accordingly, although the present invention has been shown and described in terms of several preferred embodiments thereof, it is not to be considered as limited by any of the perhaps quite fortuitous details of said embodiments or of the drawings, but only by the terms of the appended claims, which follow.

I claim:

1. A mask for a charged particle projection system comprising:

a mask base plate which comprises a diamond layer; and a scattering element, disposed upon said mask base plate defining a pattern, wherein a first characteristic scale for absorption or scattering of a beam of charged particles in said scattering element is larger than a second characteristic scale for absorption or scattering of said beam of charged particles in said mask base plate.

2. A mask for a charged particle projection system according to claim 1, wherein said scattering element is made of tungsten.

3. A mask for a charged particle projection system according to claim 1, further comprising a reinforcement layer which is made from a material other than diamond and which is layered together with said diamond layer.

4. A mask for a charged particle projection system according to claim 3, wherein said reinforcement layer is made from a semiconductor material.

5. A mask for a charged particle projection system according to claim 4, wherein said semiconductor material of said reinforcement layer is silicon.

6. A mask for a charged particle projection system according to claim 5, wherein said diamond layer is formed upon said reinforcement layer by a process of vapor phase deposition.

7. A mask for a charged particle projection system according to claim 5, further comprising an electrically conducting layer which is layered over said diamond layer.

8. A mask for a charged particle projection system according to claim 7, wherein said electrically conducting layer is formed from a non-magnetic metallic material.

9. A mask for a charged particle projection system according to claim 4, wherein said diamond layer is formed upon said reinforcement layer by a process of vapor phase deposition.

10. A mask for a charged particle projection system according to claim 4, further comprising an electrically conducting layer which is layered over said diamond layer.

11. A mask for a charged particle projection system according to claim 10, wherein said electrically conducting layer is formed from a non-magnetic metallic material.

12. A mask for a charged particle projection system according to claim 3, wherein said diamond layer is formed upon said reinforcement layer by a process of vapor phase deposition.

13. A mask for a charged particle projection system according to claim 3, further comprising an electrically conducting layer which is layered over said diamond layer.

14. A mask for a charged particle projection system according to claim 13, wherein said electrically conducting layer is formed from a non-magnetic metallic material.

15. A mask for a charged particle projection system according to claim 1, further comprising an electrically conducting layer which is layered over said diamond layer.

16. A mask for a charged particle projection system according to claim 15, wherein said electrically conducting layer is formed from a non-magnetic metallic material.

17. A method for manufacturing a mask for a charged particle projection system, comprising the steps of:

forming a diamond layer on a surface of a silicon substrate;

forming a lattice-shaped reinforcement on a rear surface of said silicon substrate by a lithographic process; and forming a scattering element for a forming pattern on said diamond layer.

18. A method for manufacturing a mask for a charged particle protection system according to claim 17, wherein said step of forming a diamond layer is a vapor phase deposition step.

* * * * *